(12) United States Patent
Okuno

(10) Patent No.: US 10,192,809 B2
(45) Date of Patent: Jan. 29, 2019

(54) SEMICONDUCTOR ARRAY AND PRODUCTION METHOD FOR MICRO DEVICE

(71) Applicant: TOYODA GOSEI CO., LTD., Kiyosu-shi (JP)

(72) Inventor: Koji Okuno, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/847,630

(22) Filed: Dec. 19, 2017

(65) Prior Publication Data
US 2018/0182689 A1    Jun. 28, 2018

(30) Foreign Application Priority Data

Dec. 28, 2016    (JP) .................................. 2016-257142

(51) Int. Cl.
| | | |
|---|---|---|
| *H01L 21/82* | (2006.01) | |
| *H01L 23/482* | (2006.01) | |
| *H01L 27/15* | (2006.01) | |
| *H01L 33/32* | (2010.01) | |
| *H01L 33/62* | (2010.01) | |

(Continued)

(52) U.S. Cl.
CPC ........ *H01L 23/4821* (2013.01); *H01L 21/764* (2013.01); *H01L 21/76885* (2013.01); *H01L 27/085* (2013.01); *H01L 27/156* (2013.01); *H01L 29/2003* (2013.01); *H01L 29/7787* (2013.01); *H01L 33/32* (2013.01); *H01L 33/62* (2013.01); *H01L 2933/0066* (2013.01)

(58) Field of Classification Search
CPC ............... H01L 23/4821; H01L 21/764; H01L 21/76885; H01L 27/085; H01L 27/156; H01L 29/2003; H01L 29/7787; H01L 2933/0066; H01L 33/62
USPC ......................................................... 257/93
See application file for complete search history.

(56) References Cited

U.S. PATENT DOCUMENTS

| 7,595,511 B2 | 9/2009 | Kang |
| 7,906,787 B2 | 3/2011 | Kang |

(Continued)

FOREIGN PATENT DOCUMENTS

| JP | 2006-339534 A | 12/2006 |
| JP | 2007-027298 A | 2/2007 |

(Continued)

OTHER PUBLICATIONS

United States Office Action dated Jul. 26, 2018 in U.S. Appl. No. 15/837,970.

*Primary Examiner* — Elias M Ullah
(74) *Attorney, Agent, or Firm* — McGinn IP Law Group, PLLC.

(57) ABSTRACT

There are provided a semiconductor array and a method for producing a micro device, in which the semiconductor laminate used in the micro device can be readily separated from the substrate. The semiconductor array includes a substrate, a bridging portion bridged to the substrate, a plurality of semiconductor laminates arranged on the bridging portion, and first voids defined by the substrate and the bridging portion. The bridging portion has a plurality of through holes formed at least one of the leg portion and the top portion. The first void communicates with the outside of the semiconductor array via the through holes. Each of the semiconductor laminates is in direct contact with each of the top portions.

8 Claims, 12 Drawing Sheets

(51) Int. Cl.
    *H01L 29/20*     (2006.01)
    *H01L 29/778*     (2006.01)
    *H01L 21/764*     (2006.01)
    *H01L 21/768*     (2006.01)
    *H01L 27/085*     (2006.01)

(56) References Cited

U.S. PATENT DOCUMENTS

2006/0208273 A1    9/2006   Kang
2009/0309107 A1   12/2009   Kang

FOREIGN PATENT DOCUMENTS

JP        2007-519214 A     7/2007
WO    WO 2005/015647 A1   2/2005

SEMICONDUCTOR ARRAY AND PRODUCTION METHOD FOR MICRO DEVICE

BACKGROUND OF THE INVENTION

Field of the Invention

The technique disclosed in the present specification relates to a semiconductor array and a method for producing a micro device.

Background Art

A micro LED has been receiving increased attention as a spontaneous light-emitting device in recent years. Through employment of micro LED, parts needed in the conventional liquid crystal display, for example, light diffusion plate or polarizing plate is unnecessary. Light absorption by parts can also be avoided. Therefore, improvement is expected in the utilization efficiency of light as a display. Thus, research and development have been carried out on micro devices (see Patent Document 1).

When a micro device such as micro LED is produced, uniform semiconductor layer grown on a growth substrate is separated into a plurality of regions. Thereafter, the growth substrate is divided according to the semiconductor layer separated each other (first method). The semiconductor layer separated into a number of regions is peeled off from the growth substrate (second method).

Patent Document 1: Japanese Translation of PCT International Application Publication No. 2007-519214

However, in the first method, the growth substrate is attached to the semiconductor layer. Thus, the LED is large. In the second method, the substrate is not necessarily easy to be peeled off from the divided semiconductor layer without damaging the semiconductor.

SUMMARY OF THE INVENTION

The technique disclosed in the present specification has been accomplished for solving problems involved in the aforementioned conventional technique. Accordingly, an object of the technique disclosed in the present specification is to provide a production method for a semiconductor array and a micro device, in which the semiconductor laminate used in the micro device can be readily separated from the substrate.

In a first aspect of the disclosure, there is provided a semiconductor array comprising: a bridging portion bridged to a substrate, a plurality of semiconductor laminates arranged on the bridging portion, and a void defined by the substrate and the bridging portion. The bridging portion has a leg portion and a top portion, and a plurality of through holes formed on at least one of the leg portion and the top portion. The void communicates with an outside of the semiconductor array through the plurality of through holes. Each of the semiconductor laminates is directly in contact with the top portion.

In the semiconductor array, the plurality of semiconductor laminates used in producing the micro device are supported by the bridging portion. In the semiconductor array, there are voids between the bridging portion and the substrate, and the leg portion of the bridging portion is relatively weak in mechanical strength. Thus, the substrate can be readily separated from the semiconductor laminates by breaking the leg portion of the bridging portion.

A second aspect of the disclosure is a specific embodiment of the semiconductor array according to the first aspect, wherein the leg portion has one or more first through hole having a first opening and a second opening at both ends of the first through hole. The top portion has one or more second through holes. The first opening of the first through hole is open toward the void. The second opening of the first through hole is open toward the outside of the semiconductor array. The second through hole is blocked with the semiconductor laminate. The threading dislocations extending toward the leg portion are not taken over by the semiconductor laminate. Therefore, the semiconductor laminate exhibits good crystallinity.

A third aspect of the disclosure is a specific embodiment of the semiconductor array according to the first or second aspect, wherein the density of the first through holes in the leg portion is larger than the density of the second through holes in the top portion. The threading dislocations are further difficult to be taken over by the semiconductor laminate.

A fourth aspect of the disclosure is a specific embodiment of the semiconductor array according to any of the first to third aspects, wherein the thickness of the top portion of the bridging portion is larger than the thickness of the leg portion of the bridging portion. The semiconductor laminate can be effectively formed.

A fifth aspect of the disclosure is a specific embodiment of the semiconductor array according to any of the first to fourth aspects, wherein the substrate has protrusions having tops and a bottom portion. A height from the bottom portion of the substrate to the top portion of the bridging portion is greater than a height from the bottom portion of the substrate to the top of each of the protrusions.

A sixth aspect of the disclosure is a specific embodiment of the semiconductor array according to the fifth aspect, wherein the height at any place of the top portion of the bridging portion as measured from the bottom portion of the substrate falls within ±10% of the average height about all places of the top portion of the bridging portion as measured from the bottom portion.

A seventh aspect of the disclosure is a specific embodiment of the semiconductor array according to any of the first to fourth aspects, wherein the substrate has a bottom portion and protrusions. The leg portion of the bridging portion is bridged in contact with the surface of the protrusions.

An eighth aspect of the disclosure is a specific embodiment of the semiconductor array according to any of the first to fourth aspects, wherein the substrate has a flat main surface. A mask layer is formed on a first region of the main surface of the substrate. The leg portion of the bridging portion is bridged in contact with the surface of the mask layer.

A ninth aspect of the disclosure is a specific embodiment of the semiconductor array according to any of the first to fourth aspects, wherein the substrate has a bottom portion and a protrusion having side portions and a flat top portion. The leg portion of the bridging portion is bridged from the bottom portion of the substrate over the flat top portion. The top portion of the bridging portion is a non-polar or semi-polar surface.

A tenth aspect of the disclosure is a specific embodiment of the semiconductor array according to any of the first to ninth aspects, wherein the bridging portion comprises Al-containing Group III nitride.

An eleventh aspect of the disclosure is a specific embodiment of the semiconductor array according to any of the first to tenth aspects, wherein the bridging portion has a thickness of 0.25 nm to 100 nm at its thickest position.

A twelfth aspect of the disclosure is a specific embodiment of the semiconductor array according to any one of the first to eleventh aspects, wherein the bridging portion has a facet plane on the surface thereof. The bridging portion has a stable form.

In a thirteenth aspect of the disclosure, there is provided a method for producing a micro device, the method comprising: a step of forming a layer to be removed through decomposition (hereinafter referred to as a "a decomposition layer") on a substrate; a step of forming a bridging portion on the decomposition layer; a step of decomposing the decomposition layer; a step of forming a plurality of semiconductor laminates on the bridging portion; and a step of separating the substrate from the semiconductor laminates. In the decomposition layer formation step, a plurality of threading dislocations are extended during growth of the decomposition layer. In the bridging portion formation step, the bridging portion having a leg portion and a top portion is formed, and the threading dislocations are exposed to the surface of the bridging portion. In the decomposition step, the threading dislocations exposed to the surface of the bridging portion are widened to thereby provide a plurality of through holes penetrating the bridging portion, and the decomposition layer is decomposed through the through holes. In the semiconductor laminate formation step, each of the semiconductor laminates is grown from the top portion of the bridging portion.

A fourteenth aspect of the disclosure is a specific embodiment of the method for producing a micro device according to the thirteenth aspect, wherein, in the decomposition step, a decomposition product generated through decomposition of the decomposition layer is discharged via the through holes to an outside of the bridging portion, to thereby provide a void in a region where the decomposition layer has remained.

A fifteenth aspect of the disclosure is a specific embodiment of the method for producing a micro device according to the thirteenth or fourteenth aspect, wherein, in the decomposition layer formation step, the decomposition layer is grown generally in the vertical direction at an initial stage of growth and is grown generally in the horizontal direction at a later stage of growth, and, in the decomposition step, first through holes of the through holes are provided in the leg portion, second through holes of the through holes are provided in the top portion, and a density of the first through holes is adjusted to be larger than a density of the second through holes.

A sixteenth aspect of the disclosure is a specific embodiment of the method for producing a micro device according to any of the thirteenth to fifteenth aspects, wherein, in the bridging portion formation step, the bridging portion is formed so that the top portion of the bridging portion has a thickness greater than a thickness of the leg portion.

A seventeenth aspect of the disclosure is a specific embodiment of the method for producing a micro device according to any of the thirteenth to sixteenth aspects, wherein an uneven substrate having an unevenly shaped portion having a bottom portion and a plurality of protrusions is provided, and in the decomposition layer formation step, the decomposition layer is grown from the bottom portion of the unevenly shaped portion of the uneven substrate.

An eighteenth aspect of the disclosure is a specific embodiment of the method for producing a micro device according to any of the thirteenth to sixteenth aspects, wherein, the method further comprises a step of forming a mask layer on a first region of a flat main surface of a substrate, wherein, in the decomposition layer formation step, the decomposition layer is formed on a second region of the main surface on which the mask layer is not formed.

A nineteenth aspect of the disclosure is a specific embodiment of the method for producing a micro device according to the eighteenth aspect, wherein, in the decomposition layer formation step, the decomposition layer is formed so as to cover the second region and a portion of the surface of the mask layer, and, in the bridging portion formation step, the bridging portion is formed so as to come into contact with the surface of the mask layer.

A twentieth aspect of the disclosure is a specific embodiment of the method for producing a micro device according to any of the thirteenth to nineteenth aspects, wherein, in the bridging portion formation step, a facet plane is formed on at least a portion of the surface of the bridging portion.

A twenty-first aspect of the disclosure is a specific embodiment of the method for producing a micro device according to any of the thirteenth to twentieth aspects, wherein, the method further comprises a step of forming an electrode on the semiconductor laminate.

In the present specification, there are provided a semiconductor array and a method for producing a micro device, in which the semiconductor laminate used in the micro device can be readily separated from the substrate.

BRIEF DESCRIPTION OF THE DRAWINGS

Various other objects, features, and many of the attendant advantages of the present technique will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
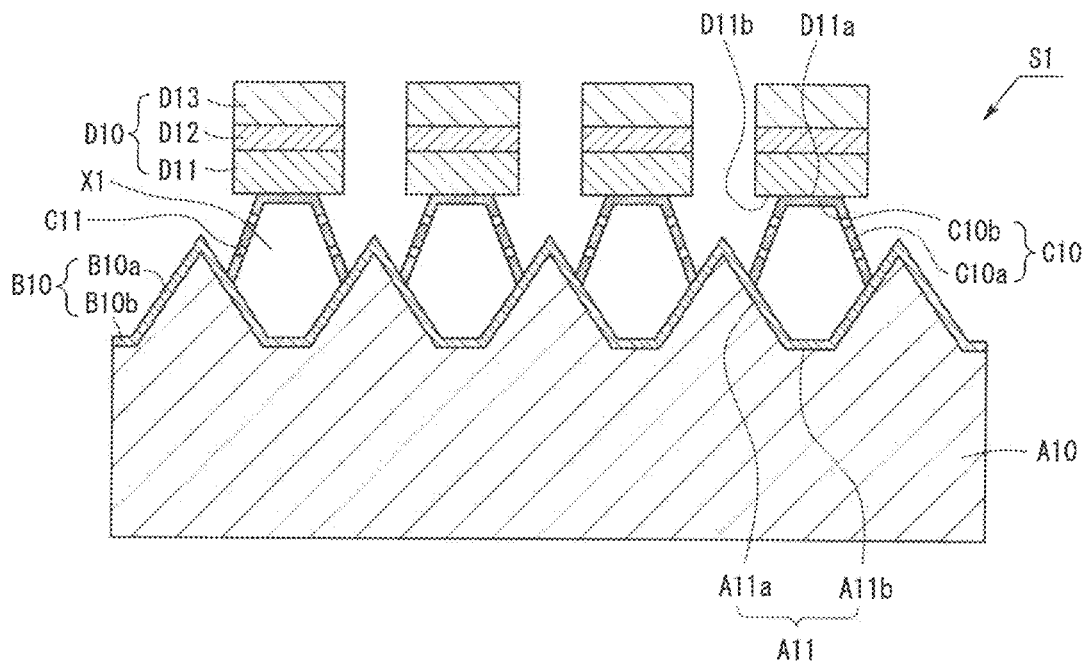
FIG. 1 schematically shows the configuration of a semiconductor array of a first embodiment.

Specific embodiments will next be described with reference to the drawings by taking, as an example, a semiconductor array and a method for producing a micro device. However, the technique disclosed in the present specification should not be limited to these embodiments. In the below-described semiconductor device, the layered structure of each layer and the structure of each electrode are shown for an exemplary purpose. Needless to say, the layered structure may differ from that described below in the embodiments. The thickness proportion of each layer which is schematically shown in the drawings does not correspond to its actual value. In some drawings, the thickness is not taken into account.

First Embodiment

1. Semiconductor Structure

FIG. 1 schematically shows the configuration of a semiconductor array S1 of a first embodiment. The semiconductor array S1 includes a substrate A10, a buffer layer B10, a bridging portion C10, a plurality of semiconductor laminates D10, and voids X1. In FIG. 1, for example, the unevenly shaped portion of the substrate is enlargedly shown for the sake of easy understanding. The same shall apply to the other drawings described below.

The substrate A10 is an uneven substrate having an unevenly shaped portion A11. The unevenly shaped portion A11 has a plurality of protrusions A11a and a bottom portion A11b. The unevenly shaped portion A11 has a plurality of recesses having a conical inner shape. The bottom portion A11b is disposed at the bottom of the recesses. The bottom portion A11b is recessed from each of the protrusions A11a toward the substrate A10. Thus, each of the protrusions A11a has a side face inclined to the main surface of the substrate A10. The bottom portions A11b are arranged in a continuous honeycomb pattern with respect to the substrate A10. The substrate A10 is formed of sapphire. The substrate A10 may be formed of a material other than sapphire; for example, SiC, Si, ZnO, GaN, AlN, $MgAl_2O_4$, or $Ga_2O_3$.

The buffer layer B10 is provided for transferring the crystal structure of the substrate A10 to a layer grown on the buffer layer B10. The buffer layer B10 has sloped portions B10a and a bottom portion B10b. The buffer layer B10 has a very small thickness. The buffer layer B10 is formed so as to follow the shape of the unevenly shaped portion A11 of the substrate A10. The sloped portions B10a of the buffer layer B10 are formed at positions facing the protrusions A11a of the substrate A10. The bottom portion B10b of the buffer layer B10 is formed at a position facing the bottom portion A11b of the substrate A10. The buffer layer B10 is formed of AlN. The buffer layer B10 has a thickness of 1 nm to 100 nm. The buffer layer B10 may have a thickness other than that described above.

The bridging portion C10 is bridged to the substrate A10. The bridging portion C10 is located between the substrate A10 and the semiconductor laminates D10. The bridging portion C10 has a leg portion C10a and a plurality of top portions C10b. The leg portion C10a is integrated with the top portions C10b. The leg portion C10a supports the top portions C10b and the semiconductor laminates D10. The leg portion C10a is formed so as to extend from the protrusion A11a of the substrate A10. That is, the bridging portion C10 is bridged to the protrusions A11a of the substrate A10. In this case, the bridging portion C10 is supported by the side faces of the protrusions A11a of the substrate A10. At least a portion of the leg portion C10a is not in contact with the semiconductor laminates D10. The top portions C10b have a flat surface. Each of the top portions C10b is in direct contact with each of the semiconductor laminates D10. The bridging portion C10 is formed of AlN.

The semiconductor laminates D10 are arranged on the bridging portion C10. Each of the semiconductor laminates D10 is in direct contact with each of the top portions C10b. That is, the semiconductor laminates D10 are separately arranged on the top portions C10b. The semiconductor laminate D10 includes one or more semiconductor layers. The semiconductor laminate D10 has a first semiconductor layer D11, a second semiconductor layer D12, and a third semiconductor layer D13.

The semiconductor laminate D10 is in contact with a portion of the leg portion C10a of each bridging portion C10 and is in contact with the top portion C10b of the bridging portion C10. The first semiconductor layer D11 on the substrate A10 side of the semiconductor laminate D10 has a first site D11a and a second site D11b. The first site D11a is in contact with the top portion C10b of each bridging portion C10. The second site D11b is not in contact with the bridging portion C10. The second site D11b slightly protrudes from the top portion C10b of the bridging portion C10 toward the substrate A10. The second site D11b faces the leg portion C10a of the bridging portion C10 and the protrusion A11a of the substrate A10.

2. Bridging Portion and Void 2-1. Shape of Bridging Portion

Figure 2:
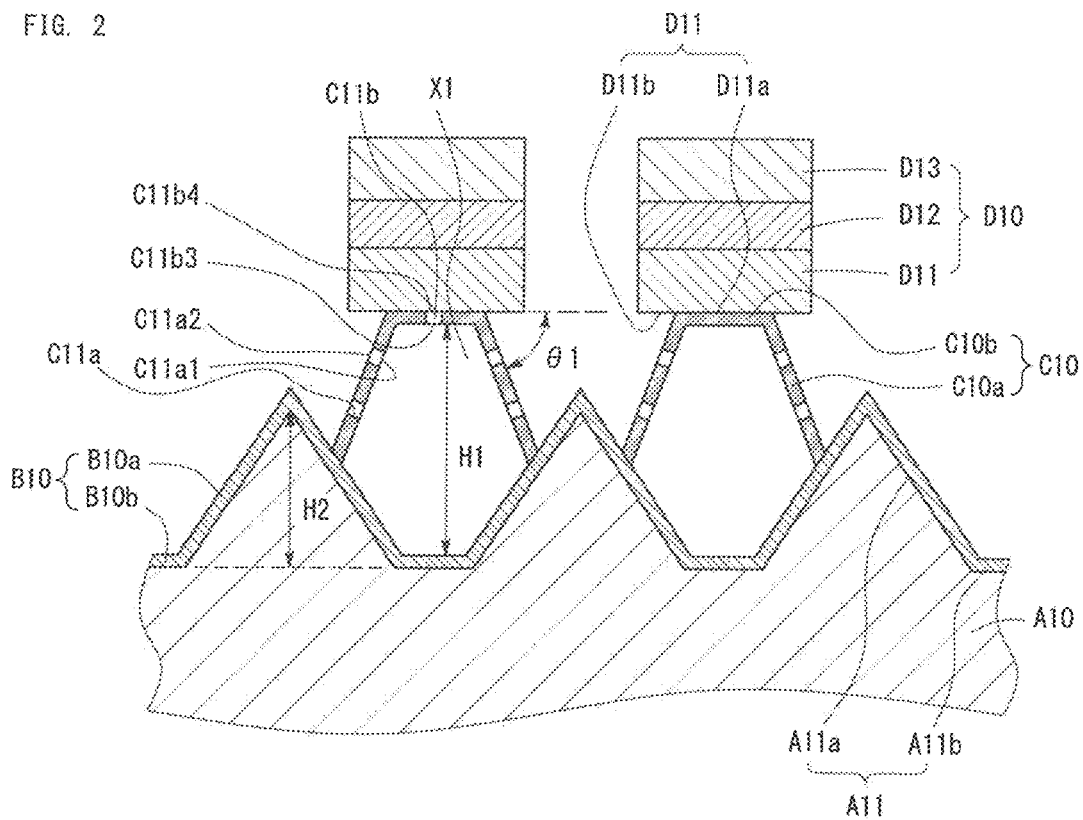
FIG. 2 is an enlarged view of a region around bridging portion in the semiconductor array of the first embodiment.

FIG. 2 is an enlarged view of a region around the bridging portion C10. As shown in FIG. 2, the bridging portion C10 is formed so as to extend from the sloped portions B10a of the buffer layer B10. The bridging portion C10 is supported by the protrusions A11a of the substrate A10. As shown in FIG. 2, the angle θ1 between the leg portion C10a of each bridging portion C10 and the top portion C10b of the bridging portion C10 is 10° to 90°.

The top portions C10b of the bridging portion C10 have approximately the same height. Thus, the height at a position of each top portion C10b as measured from the bottom portion A11b of the substrate A10 falls within a range of ±10% of the average height of the top portions C10b as measured from the bottom portion A11b.

2-2. Region of Bridging Portion

The bridging portion C10 is formed along the bottom portion A11b of the substrate A10. In particular, the top portions C10b of the bridging portion C10 are located at positions facing the bottom portion A11b of the substrate A10. The semiconductor laminate D10 is grown from the top portions C10b.

2-3. Thickness of Bridging Portion

The thickest portion of each bridging portion C10 has a thickness of 0.25 nm to 100 nm, preferably 0.5 nm to 60 nm, more preferably 1 nm to 30 nm. The thickness of each bridging portion C10 may be equal to or greater than a level such that the bridging portion C10 can support the semiconductor laminate D10. If the bridging portion C10 has a large thickness, the below-described etching process requires a long period of time to make through holes C11a and C11b. The preferred thickness may depend on the material of the bridging portion C10. If the bridging portion C10 contains Al, the bridging portion C10 may have a large lattice mismatch with the decomposition layers described below. Thus, if the below-described decomposition layers (E1) are formed of GaN and the bridging portion C10 is formed of AlN, the bridging portion C10 preferably has a small thickness.

The leg portion C10a may have a thickness greater than that of the top portions C10b. In such a case, the leg portion C10a exhibits high mechanical strength. Alternatively, the leg portion C10a may have a thickness smaller than that of the top portions C10b. In such a case, the semiconductor laminate D10 can be readily removed from the substrate A10.

2-4. Through Hole of Bridging Portion

As shown in FIG. 2, each bridging portion C10 has a plurality of through holes. The through holes are formed at least one of the leg portion C10a and the top portion C10b. Specifically, the bridging portion C10 has first through holes C11a provided in the leg portion C10a, and second through holes C11b provided in the top portion C10b. The leg portion C10a of the bridging portion C10 has a relatively large number of first through holes C11a. The number of the first through holes C11a of the leg portion C10a is greater than that of the second through holes C11b of the top portion C10b. The density of the first through holes C11a of the leg portion C10a is higher than that of the second through holes C11b of the top portion C10b.

As described below, the first through holes C11a and the second through holes C11b are caused by threading dislocations. The first through holes C11a and the second through holes C11b may have any cross-sectional shape; for example, a circular shape, an elliptical shape, a polygonal shape (e.g., a hexagonal shape), or a striped shape. Two or more through holes caused by two or more threading dislocations may be connected together, thereby providing a relatively large through hole.

Each second through hole C11b extends from the substrate A10 side toward the semiconductor laminate D10. At least the opening at the side of the semiconductor laminate D10 in the second through hole C11b is blocked with the semiconductor laminate D10. Both openings of the second through hole C11b may be blocked with the semiconductor laminate D10. Hence, the semiconductor laminate D10 has no through holes.

Each first through hole C11a has a first opening C11a1 and a second opening C11a2. The first opening C11a1 is open toward a first void X1 described below. The second opening C11a2 is not blocked with the semiconductor laminate D10, but is open toward the outside of the semiconductor array S1.

Each second through hole C11b has a third opening C11b3 and a fourth opening C11b4. The third opening C11b3 is open toward a first void X1 described below. The fourth opening C11b4 is blocked with the semiconductor laminate D10. As described above, both of the third opening C11b3 and the fourth opening C11b4 may be blocked with the semiconductor laminate D10. In such a case, the semiconductor laminate D10 grows through the fourth opening C11b4 and reaches the third opening C11b3.

2-5. Void

As shown in FIG. 2, the semiconductor array S1 has first voids X1 and second voids X2 defined between the unevenly shaped portion A11 of the substrate A10 and the semiconductor laminate D10. The first void X1 communicates with the outside of the semiconductor array S1 via the through holes C11a.

Each first void X1 is defined by the unevenly shaped portion A11 of the substrate A10 and the bridging portion C10. More specifically, the first void X1 is defined by the bottom portion A11b of the substrate A10, a portion of the protrusion A11a of the substrate A10, the leg portion C10a of the bridging portion C10, and the top portion C10b of the bridging portion C10. In other words, the first void X1 is defined by the bottom portion B10b of the buffer layer B10, a portion of the sloped portion B10a of the buffer layer B10, the leg portion C10a of the bridging portion C10, and the top portion C10b of the bridging portion C10. The first void X1 is located at a position facing the bottom portion A11b of the substrate A10.

As shown in FIG. 2, the height H1 from the bottom portion A11b of the substrate A10 to the top of each of the top portions C10b of the bridging portion C10 is greater than the height H$_2$ from the bottom portion A11b of the substrate A10 to the top of each of the protrusions A11a of the substrate A10.

Figure 3:
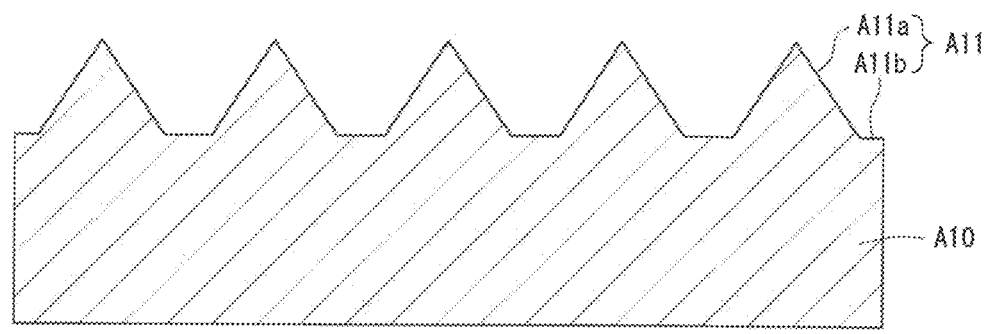
FIG. 3 illustrates a production method for the semiconductor array of the first embodiment (part 1)

3. Production Method for Semiconductor Structure 3-1. Step of Providing Substrate Firstly, the substrate A10 is provided as shown in FIG. 3. As described above, the substrate A10 has the unevenly shaped portion A11. The unevenly shaped portion A11 of the substrate A10 has a plurality of protrusions A11a and a bottom portion A11b. The protrusions A11a have a conical shape. The protrusions A11a are arranged at lattice points of a honeycomb pattern on the main surface of the substrate A10. The unevenly shaped portion A11 may be formed through etching of the substrate. Alternatively, the substrate A10 already machined having the unevenly shaped portion A11 may be provided.

3-2. Step of Forming Buffer Layer

Figure 4:
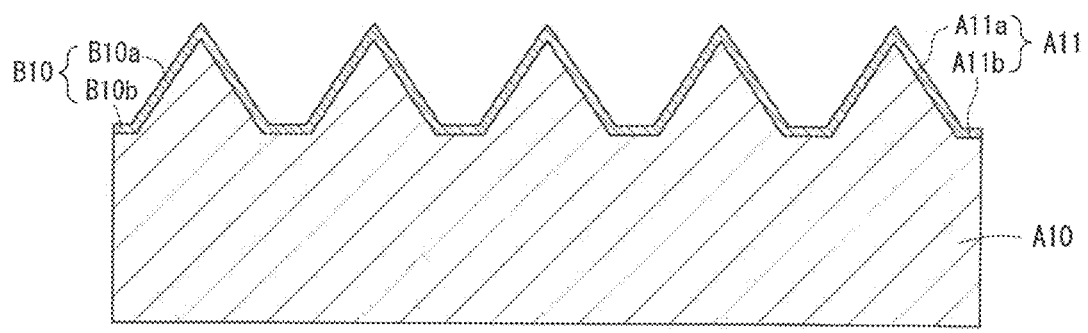
FIG. 4 illustrates the production method for the semiconductor array of the first embodiment (part 2)

Subsequently, as shown in FIG. 4, the buffer layer B10 is formed on the substrate A10 by means of, for example, MOCVD. The buffer layer B10 has a thickness considerably smaller than the height of the unevenly shaped portion of the substrate A10. Thus, the buffer layer B10 is formed so as to follow the shape of the unevenly shaped portion of the substrate A10. The buffer layer B10 having the sloped portions B10a and the bottom portion B10b is thereby formed. The buffer layer B10 is formed of AlN.

3-3. Step of Forming Decomposition Layer

Figure 5:
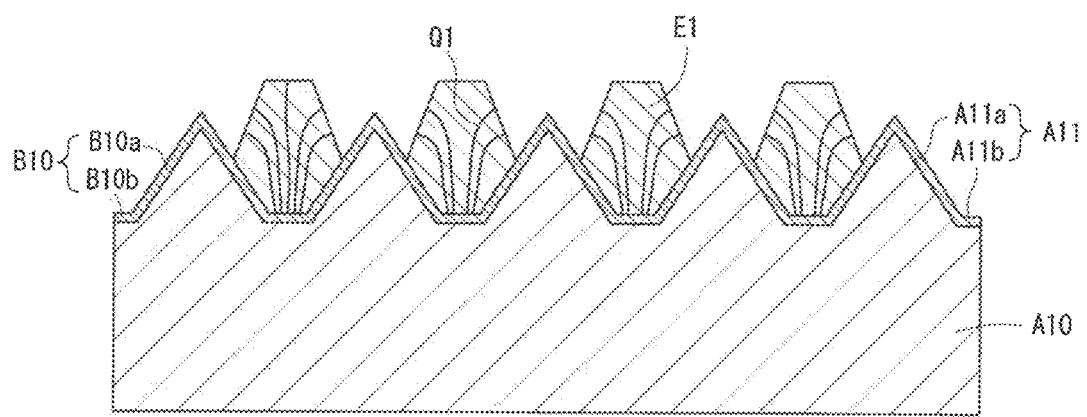
FIG. 5 illustrates the production method for the semiconductor array of the first embodiment (part 3)

As shown in FIG. 5, decomposition layers E1 are formed on the substrate A10. More specifically, the decomposition layers E1 are formed on the bottom portion B10b and the sloped portions B10a of the buffer layer B10 provided on the unevenly shaped portion A11. InGaN layers are formed as the decomposition layers E1 by means of MOCVD. The InGaN layers are thermally decomposed at a relatively low temperature. The thus-formed decomposition layers E1, which are semiconductor layers, are removed through an etching step described below.

Each decomposition layer E1 is grown generally in the vertical direction at an initial stage of growth, and the decomposition layer E1 is grown generally in the horizontal direction at a later stage of growth. Thus, many threading dislocations Q1 extend in an oblique direction. Specifically, many threading dislocations Q1 extend toward a sloped face E1a rather than a top face E1b. Each decomposition layer E1 is grown from the bottom portion B10b of the buffer layer B10 provided on the substrate A10. Consequently, the decomposition layer E1 is formed on the bottom portion A11b of the substrate A10 and a portion of the adjacent protrusions A11a. Thus, the decomposition layer E1 are grown while extending the threading dislocations Q1.

The thermal decomposition temperature of the decomposition layers E1 is lower than that of the bridging portion C10. The growth temperature of the decomposition layers E1 is 750° C. to 1,150° C., preferably 900° C. to 1,150° C., more preferably 1,000° C. to 1,120° C.

3-4. Step of Forming Bridging Portion

Figure 6:
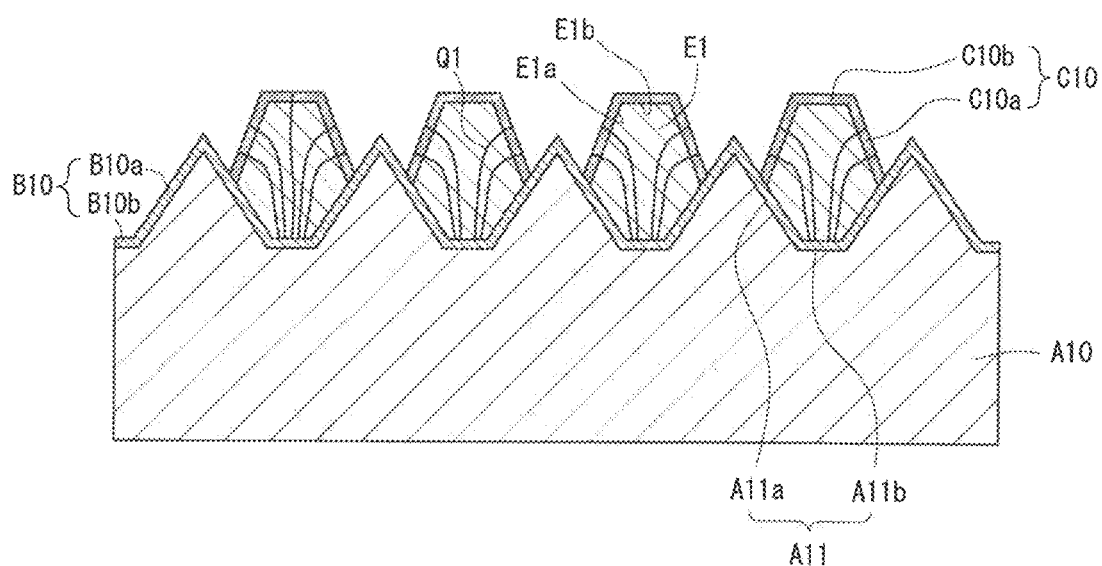
FIG. 6 illustrates the production method for the semiconductor array of the first embodiment (part 4)

Subsequently, as shown in FIG. 6, the bridging portion C10 having the leg portion C10a and the top portions C10b is formed on the decomposition layers E1. The bridging portion C10 may be formed by means of MOCVD. Alternatively, the bridging portion C10 may be formed by means of sputtering. As described above, the bridging portion C10 is formed of AlN. The bridging portion C10 is formed so as to cover the decomposition layers E1. The threading dislocations Q1 extend toward the leg portion C10a of the bridging portion C10. The threading dislocations Q1 are then exposed to the surfaces of the bridging portion C10. A facet plane is preferably formed on at least a portion of the surface of the bridging portion.

3-5. Etching Step (Decomposition Step)

Figure 7:
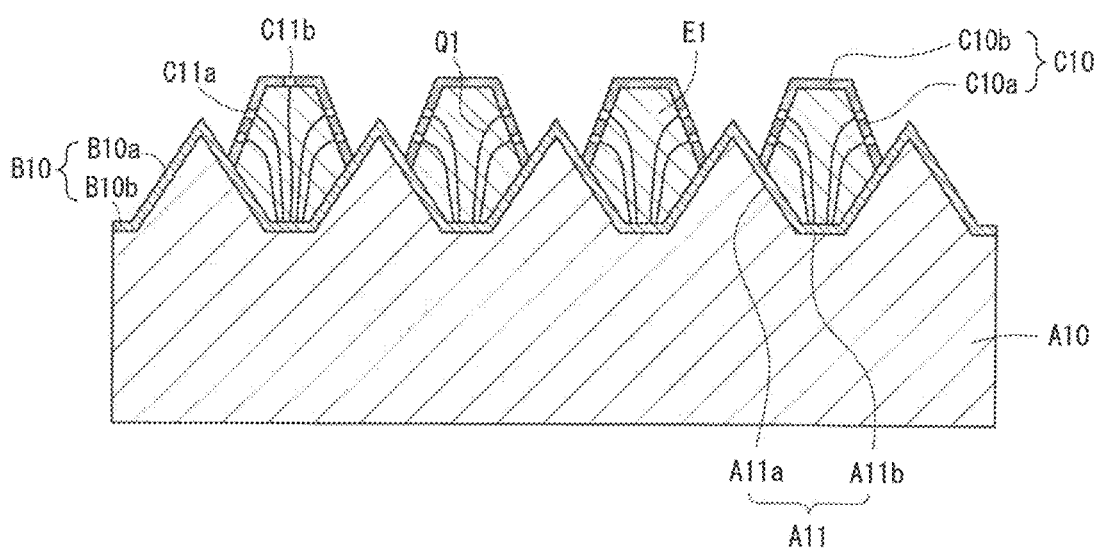
FIG. 7 illustrates the production method for the semiconductor array of the first embodiment (part 5)

Subsequently, as shown in FIG. 7, the decomposition layers E1 are etched. A gas mixture containing $H_2$ gas and at least one of $N_2$ gas and $NH_3$ gas is supplied for the etching. The substrate temperature is adjusted to a temperature equal to or higher than the thermal decomposition temperature of the decomposition layers E1 and lower than the thermal decomposition temperature of the bridging portion C10. The threading dislocations Q1 are lattice defects due to breakage of interatomic bonds. Accordingly, the decomposition of the semiconductor is likely to occur from the threading dislocations Q1. Thus, even if the semiconductor material has high thermal decomposition temperature, the decomposition of the semiconductor occurs from the threading dislocations Q1. Therefore, the surface of the bridging portion C10 is etched from the threading dislocations Q1. Consequently, through holes C11a are provided in the leg portion C10a of the bridging portion C10, and through holes C11b are provided in the top portions C10b of the bridging portion C10. The gas mixture widens the threading dislocations Q1 exposed to the surfaces of the bridging portion C10, to thereby provide the through holes C11a and C11b penetrating the bridging portion C10. Thus, the decomposition layers E1 are exposed in the interior of the through holes C11a and C11b.

Figure 8:
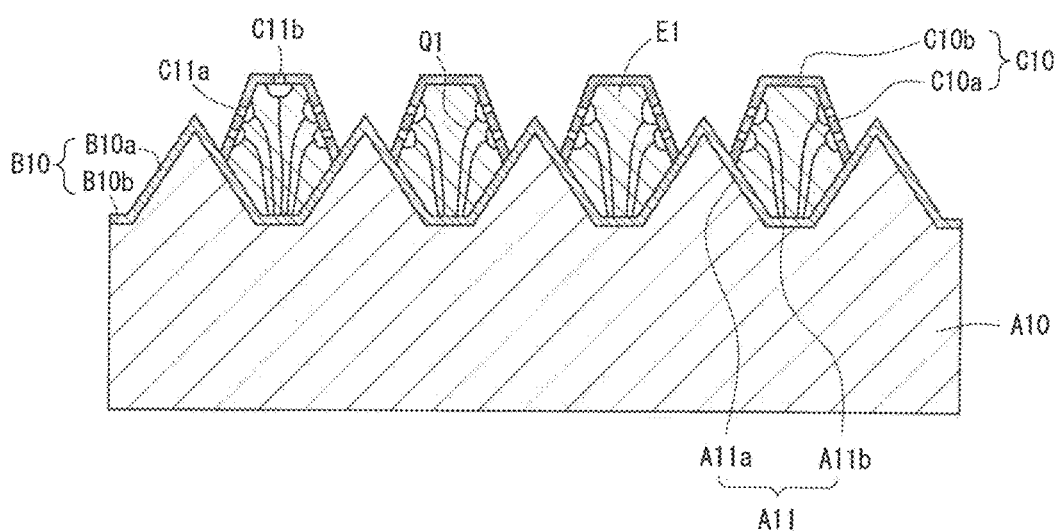
FIG. 8 illustrates the production method for the semiconductor array of the first embodiment (part 6)

As shown in FIG. 8, the gas mixture decomposes the decomposition layers E1 exposed in the interior of the through holes C11a and C11b. The decomposition layers E1 are thermally decomposed and etched by means of $H_2$ gas. Decomposition products generated through decomposition of the decomposition layers E1 are discharged via the through holes C11a and C11b to the outside of the bridging portion C10.

Figure 9:
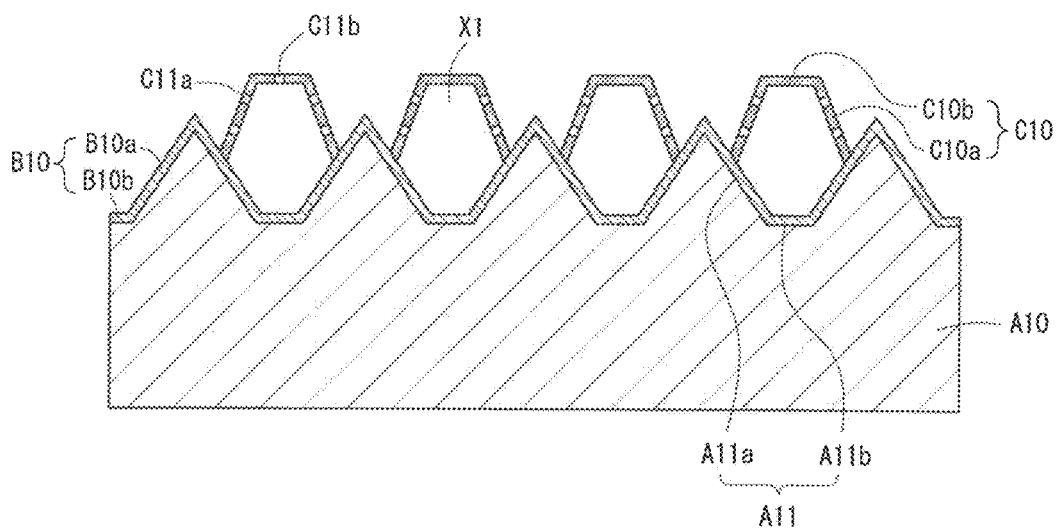
FIG. 9 illustrates the production method for the semiconductor array of the first embodiment (part 7)

As shown in FIG. 9, the decomposition layers E1 are then etched. Since the bridging portion C10 is not thermally decomposed, the bridging portion C10, which has the through holes C11a and C11b, remain after the etching. Thus, the first voids X1 are provided in regions where the decomposition layers E1 have remained. Each of the first voids X1 is defined by the substrate A10 and the bridging portion C10.

Since the threading dislocations Q1 are concentrated on the sloped faces E1a of the decomposition layers E1, the density of the through holes C11a of the leg portion C10a is higher than that of the through holes C11b of the top portions C10b.

$H_2$ gas contained in the gas mixture widens the threading dislocations Q1 and etches the decomposition layers E1. Thus, the partial pressure of $H_2$ gas is preferably increased. However, the supply of $H_2$ gas alone may cause leaching of Ga metal in the form of droplets. Therefore, $N_2$ gas or $NH_3$ gas is preferably supplied in addition to $H_2$ gas.

Preferably, the gas supplied in the etching step does not contain oxygen. Oxygen oxidizes AlN on the surface of the bridging portion C10 to thereby form AlON. The presence of AlON probably causes inversion of the polarity of a semiconductor layer above the bridging portion C10. Thus, the formation of AlON on the surface of the bridging portion C10 generates a polarity-inverted site and a non-polarity-inverted site in the semiconductor laminate D10. Accordingly, the semiconductor laminate D10 formed above the bridging portion C10 exhibits poor crystallinity. Thus, preferably, the gas supplied in the etching step does not contain oxygen. In the case where the substrate A10 contains oxygen atoms, oxygen atoms may remain in the reaction furnace. The remaining oxygen atoms may react with AlN on the surface of the bridging portion C10 to thereby form AlON. Thus, preferably, the etching step is immediately followed by the subsequent step for preventing the formation of AlON.

3-6. Step of Forming Semiconductor Laminate

Subsequently, a plurality of semiconductor laminates D10 is grown on the bridging portion C10. More specifically, each of the semiconductor laminates D10 is grown on each of the top portions C10b of the bridging portion C10. The semiconductor laminate D10 is grown from the top portions C10b of the bridging portion C10. Thus, the semiconductor laminate D10 appropriately fills the through holes C11b of the top portions C10b; i.e., the through holes C11b provided in the top portions C10b are blocked. The threading dislocations Q1 extending toward the leg portion C10a are barely transferred to the semiconductor laminate D10.

The semiconductor layer is slightly grown from the leg portion C10a of the bridging portion C10. In some cases, the semiconductor laminate D10 may be grown on regions of the leg portion C10a adjacent to the top portions C10b. Thus, the semiconductor laminate D10 may block only a small number of the through holes C11a of the leg portion C10a. However, the semiconductor laminate D10 does not block all the through holes C11a of the leg portion C10a; i.e., at least some of the through holes C11a provided in the leg portion C10a are not blocked with the semiconductor laminate D10.

The semiconductor array S1 shown in FIG. 1 is produced through the above-described steps.

4. Production Method for Micro Device 4-1. Step of Producing Semiconductor Array As described above, the semiconductor array S1 will be produced.

4-2. Step of Separating Substrate

Figure 10:
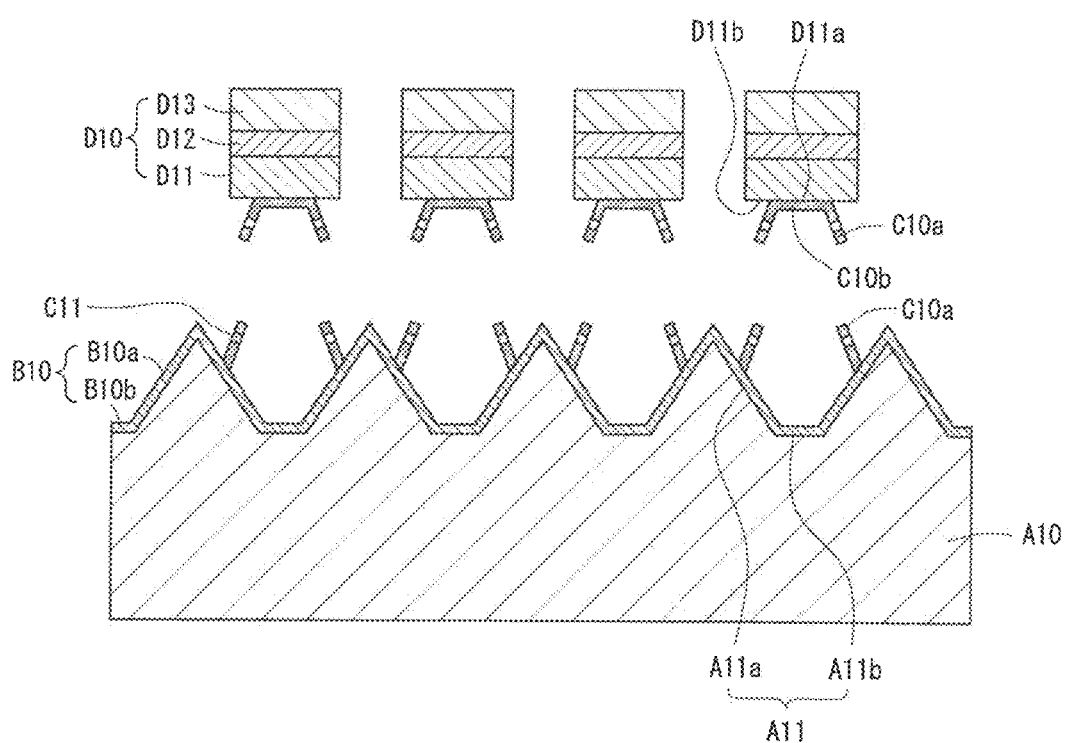
FIG. 10 illustrates the production method for the micro device of the first embodiment.

Subsequently, as shown in FIG. 10, the substrate A10 is separated from the semiconductor laminates D10. The leg portion C10a of the bridging portion C10 of the semiconductor array S1 exhibits the lowest mechanical strength. Thus, the substrate A10 is separated from the semiconductor laminates D10 at the leg portion C10a of the bridging portion C10. The substrate A10 may be separated from the semiconductor laminates D10 at the contact portions between the leg portion C10a of the bridging portion C10 and the substrate A10.

4-3. Polishing Step

The leg portion 10a of the bridging portion C10 is sometimes stuck to the separated semiconductor laminates D10. The bridging portion C10 of the semiconductor laminates D10 are polished through polishing or wet etching.

4-4. Electrode Formation Step

An electrode is formed on the semiconductor laminates D10. A micro semiconductor device is produced through the above-described steps.

5. Micro Device 5-1. First Micro Device

Figure 11:
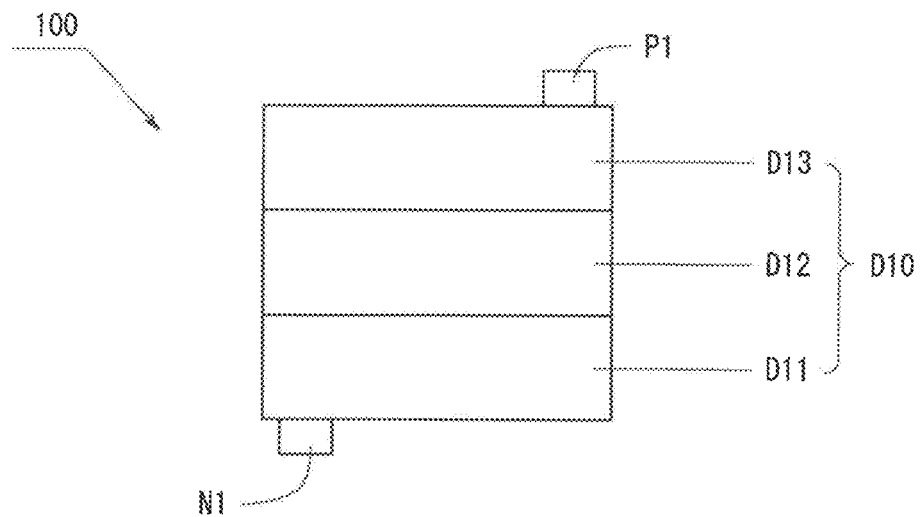
FIG. 11 schematically shows the configuration of a first micro device of the first embodiment.

FIG. 11 schematically shows the configuration of a micro semiconductor device 100. The semiconductor light-emitting device 100 is a first micro device. The semiconductor light-emitting device 100 includes a first semiconductor layer D11, a second semiconductor layer D12, a third semiconductor layer D13, an n-electrode N1, and a p-electrode P1. The first semiconductor layer D11 is an n-type semiconductor layer. The second semiconductor layer D12 is a light-emitting layer. The third semiconductor layer D13 is a p-type semiconductor layer. The n-electrode N1 is provided on the first semiconductor layer D11. The p-electrode P1 is provided on the third semiconductor layer D13.

5-2. Second Micro Device

Figure 12:
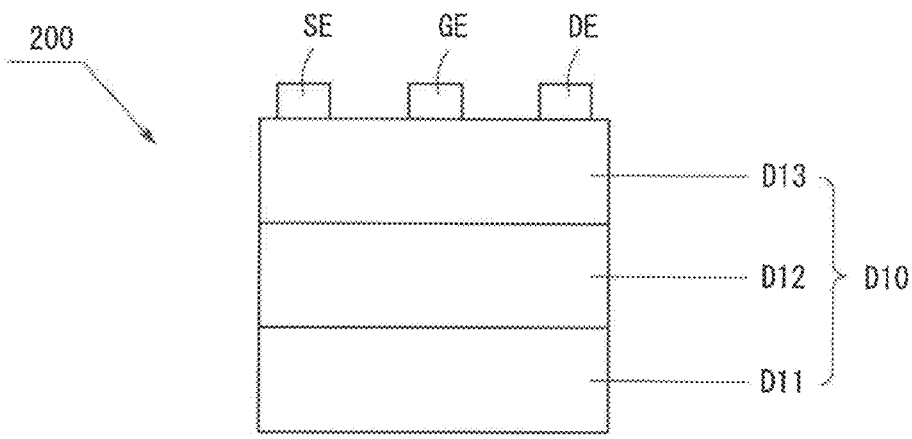
FIG. 12 schematically shows the configuration of a second micro device of the first embodiment.

FIG. 12 schematically shows the configuration of a micro HEMT 200. The HEMT 200 is a second micro device. The HEMT 200 includes a first semiconductor layer D11, a second semiconductor layer D12, a third semiconductor layer D13, a gate electrode GE, and a source electrode SE, a drain electrode DE. The first semiconductor layer D11 is, for example, a GaN layer or AlN layer. The second semiconductor layer D12 is, for example, an UID-GaN (Unintentionally Doped GaN) layer. The third semiconductor layer D13 is, for example, an AlGaN layer. The gate electrode GE, the source electrode SE, and the drain electrode DE are provided on the third semiconductor layer D13.

5-3. Other Micro Device

In addition to the above micro devices, the technique of the first embodiment is applicable to various micro semiconductor device such as laser diode (LD) or light receiving device.

The technique of the first embodiment is further applicable to semiconductor particle having no electrode. In this case, semiconductor laminates D10 having a superlattice structure or a quantum dot structure are formed. In this way, semiconductor particle with a quantum structure can be produced. Such semiconductor particle may be used as a wavelength conversion member of LED lights.

3. Effects of First Embodiment

In the first embodiment, the semiconductor array S1 has the bridging portion C10 exhibiting a relatively low mechanical strength and the micro top portions C10b from which the semiconductor laminates D10 are grown. Thus, a large number of micro semiconductor laminates D10 can be grown on the substrate A10. Such semiconductor laminates D10 can be readily separated from the substrate A10 because the leg portion C10a exhibits a relatively low mechanical strength as described above.

In the semiconductor array S1 of the first embodiment, most of the threading dislocations Q1 extend toward the leg portion C10a of the bridging portion C10. Only a few threading dislocations Q1 extend toward the top portions C10b of the bridging portion C10. The semiconductor laminates D10 are grown from the top portions C10b of the bridging portion C10. Accordingly, the threading dislocations of the layers below the bridging portion C10 are barely transferred to the semiconductor laminates D10. Thus, the resultant semiconductor laminates D10 have very low threading dislocation density. That is, the semiconductor laminates D10 exhibit excellent crystallinity.

In the first embodiment, the micro device does not have a growth substrate. The micro device is mounted on a substrate. Therefore, the micro device may slightly receive a stress from the mounted substrate. However, the micro device does not receive a strain or stress from the growth substrate used for growing the semiconductor layer.

7. Modifications 7-1. Material of Bridging Portion

In the first embodiment, the bridging portion C10 is composed of an AlN layer formed at a high temperature. The thermal decomposition temperature of the bridging portion C10 is higher than that of the decomposition layers E1. The bridging portion C10 may be composed of an AlN layer formed at a low temperature. The bridging portion C10 may be composed of an AlGaN layer or an AlGaInN layer. The bridging portion C10 preferably contains an Al-containing Group III nitride. The bridging portion C10 may be formed of GaN or InGaN, which depends on the material for the decomposition layers E1.

In the case where the bridging portion C10 is formed of a semiconductor other than AlN. Polishing step may be skipped. For example, an electrode may be formed on the remaining bridging portion C10

7-2. Angle Between Top Portion and Leg Portion of Bridging Portion

The angle θ1 between the leg portion C10a and top portion C10b of each bridging portion C10 is 10° to 90°. The angle θ1 may be 0° to 90°. In the case where the angle θ1 is 0°, the leg portion C10a is not distinguished from the top portion C10b.

7-3. Area of Top Portion of Bridging Portion

The total area of the top portions C10b of the bridging portion C10 that are in contact with the semiconductor laminates D10 is preferably smaller than a half of the area of the main surface of the substrate A10. In such a case, the threading dislocations generated in the layers below the bridging portion C10 are less likely to propagate to the semiconductor laminates D10 because the each area of the top portions C10b of the bridging portion C10 is smaller. As used herein, the "main surface" of the substrate A10 refers to the surface of the substrate A10 on which the bridging portion C10 is bridged.

7-4. Thickness of Leg Portion and Top Portion of Bridging Portion

The thickness of the top portion C10b of each bridging portion C10 is preferably greater than that of the leg portion C10a of the bridging portion C10. In such a case, the semiconductor laminates D10 having high crystallinity are likely to be grown from the top portions C10b and the semiconductor laminates D10 can be easily separated from the substrate A10.

7-5. Bridging Portion Having Multilayer Structure

In the first embodiment, each bridging portion C10 is formed of a single AlN layer. The bridging portion C10 may have a multilayer structure. Alternatively, the bridging portion C10 may have a superlattice structure; for example, a superlattice structure formed of an AlN layer and a GaN layer. Preferably, the entire bridging portion C10 does not have an excessively large thickness.

7-6. Facet Plane of Bridging Portion

The surface of the leg portion C10a of each bridging portion C10 may be a facet plane; for example, (10-1X) plane or (11-2X) plane. The surface of the top portion C10b of the bridging portion C10 may also be a facet plane; for example, (0001) plane. In such a case, the bridging portion C10 has a stable form.

7-7. Material of Decomposition Layer

In the first embodiment, each decomposition layer E1 is an InGaN layer. The decomposition layer E1 may be a GaN layer. The decomposition layer E1 may be doped with Si or Mg. In particular, Si promotes a three-dimensional growth mode (anti-surfactant effect). Thus, the decomposition layer E1 is preferably doped with Si. Needless to say, the decomposition layer E1 preferably has a low thermal decomposition temperature. Hence, the decomposition layer E1 preferably contains In. The incorporation of Al tends to increase the thermal decomposition temperature. In the case where the decomposition layer E1 contains Al, the Al content of the decomposition layer E1 is preferably lower than that of the bridging portion C10. The decomposition layer E1 may be formed of BN or a material other than a Group III nitride (e.g., BN or TiN), so long as the decomposition layer E1 has a thermal decomposition temperature lower than that of the bridging portion C10. The decomposition layer E1 is preferably formed of a Group III nitride semiconductor having a composition similar to that of the semiconductor layer formed later. The use of such a Group III nitride semiconductor can prevent the intrusion of impurities into the later-formed semiconductor layer. Thus, the decomposition layer E1 is preferably formed of InGaN.

7-8. Material of Buffer Layer

In the first embodiment, the buffer layer B10 is formed of AlN. The AlN layer includes a low-temperature buffer layer and a high-temperature buffer layer. The buffer layer B10 may be formed of (in place of AlN) a low-temperature GaN buffer layer, a BN layer, a TiN layer, an SiNx layer, or a mixture thereof.

7-9. Unevenly Shaped Portion of Substrate

In the first embodiment, the substrate A10 has a plurality of protrusions A11a and a bottom portion A11b. The bottom portion A11b is the bottom of a truncated conical shape. However, the bottom portion A11b may be the bottom of a truncated polygonal conical shape. In such a case, the bottom portion A11b is a polygon.

7-10. Decomposition Step (Etching Step)

The etching step involves supply of a gas mixture of $H_2$ gas and at least one of $N_2$ gas and $NH_3$ gas. However, $H_2$ gas is not necessarily supplied. In such a case, the decomposition layers E1 are not etched by $H_2$ gas, but are only thermally decomposed. In such a case, the through holes C11a and C11b of the bridging portion C10 can be easily made by thermal decomposition if the bridging portion C10 has a sufficiently small thickness. Accordingly the decomposition layers E1 can be easily removed by only thermal decomposition.

7-11. Residue

In the first embodiment, the decomposition layers E1 are removed through etching. However, a portion of the decomposition layers E1 may remain as a residue in the semiconductor array S1. In such a case, the residue remains in the first voids X1. The residue contains, for example, InGaN or GaN.

7-12. Layered Structure of Semiconductor Laminate

In the first embodiment, the semiconductor laminate D10 is composed of one or more semiconductor layers. The semiconductor laminate D10 may have any layered structure. Any semiconductor laminate D10 may be formed according to the semiconductor structure of the micro device.

7-13. Combination

The above-described modifications may be used in any combination.

8. Summary of First Embodiment

As described above in detail, the semiconductor array S1 of the first embodiment includes the substrate A10, the bridging portion C10, the semiconductor laminates D10, and the first voids X1 provided between the substrate A10 and the bridging portion C10. The leg portion C10a of the bridging portion C10 exhibits a relatively low mechanical strength. Thus, the substrate A10 can be readily separated from the semiconductor laminates D10.

The threading dislocations Q1 extend from the decomposition layers E1 toward the leg portion C10a of the bridging portion C10. The threading dislocations barely extend into the top portions C10b of the bridging portion C10. Meanwhile, the semiconductor laminates D10 are grown from the top portions C10b of the bridging portion C10. Accordingly, the threading dislocations Q1 are barely transferred to the semiconductor laminates D10. Thus, the semiconductor array S1 is achieved having the semiconductor laminates D10 exhibiting excellent crystallinity.

The above-described embodiment is merely an example. Thus, needless to say, various modifications and variations may be made without departing from the scope of the embodiment. For example, the semiconductor layer is not necessarily grown through metal-organic chemical vapor deposition (MOCVD), and may be grown by any other crystal growth method using a carrier gas. Alternatively, the semiconductor layer may be formed by another epitaxial growth method, such as liquid-phase epitaxy or molecular beam epitaxy.

Second Embodiment

The second embodiment will now be described. The second embodiment involves the use of ELO (Epitaxial Lateral Overgrowth) techniques. Thus, the second embodiment will be described by focusing on the difference from the first embodiment.

1. Semiconductor Light-Emitting Device

Figure 13:
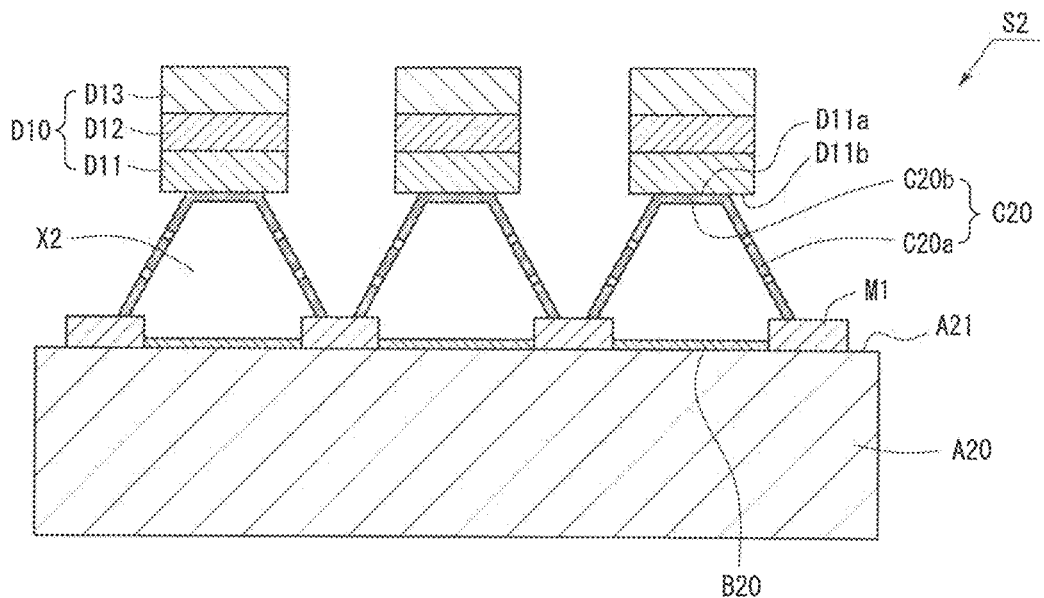
FIG. 13 schematically shows the configuration of a semiconductor array of a second embodiment.

FIG. 13 schematically shows the configuration of a semiconductor array S2 of the second embodiment. The semiconductor array S2 includes a substrate A20, mask layers M1, buffer layers B20, bridging portions C20, and semiconductor laminates D10. The substrate A20 has a flat main surface A21 having no irregularities.

The mask layers M1 are formed on the main surface A21 of the substrate A20. The main surface A21 has first regions and second regions. The first regions correspond to a region of the main surface on which the mask layer M1 is formed. Accordingly, the mask layers M1 are formed on the first regions of the main surface A21 of the substrate A20. The second regions correspond to a region of the main surface on which the mask layer is not formed. The second region is preferably a circle or may be a polygon. The buffer layers B20 are formed on the second regions.

The bridging portions C20 are formed on the surfaces of the mask layers M1. Each of the bridging portions C20 has a leg portion C20a and a top portion C20b. The leg portion C20a is bridged in contact with the surface of the mask layer M1.

Each of the semiconductor laminates D10 is formed on each of the top portions C20b of the bridging portions C20.

2. Void

The semiconductor array S2 has voids X2. The voids X2 are first voids. The voids X2 are defined by the substrate A20, the leg portions C20a of the bridging portions C20, and the top portions C20b of the bridging portions C20.

3. Production Method for Semiconductor Array

The production method for the semiconductor array will be described by focusing on the difference from the second embodiment.

3-1. Step of Preparing Substrate

Firstly, the substrate A20 having a flat main surface A21 is prepared.

3-2. Step of Forming Mask Layer

The mask layers M1 are formed on the first regions of the main surface A21 of the substrate A20. For example, the mask layers M1 are formed from $SiO_2$.

3-3. Step of Forming Buffer Layer

Subsequently, the buffer layer is formed on the second regions of the main surface A21 of the substrate A20. The second regions correspond to a region of the main surface of the substrate A20 on which no mask layer M1 is formed. In this case, the buffer layer is not formed on the mask layers M1.

3-4. Step of Forming Decomposition Layer

Thereafter, the decomposition layers are formed on the buffer layer. The decomposition layers are formed on the second regions. Each decomposition layer is grown so as to cover the second region and a portion of the surfaces of the mask layers M1.

3-5. Step of Forming Bridging Portion

The bridging portions C20 are then formed on the decomposition layers. In this case, the lower ends of the leg portions C20a of the bridging portions C20 are in contact with the surfaces of the mask layers M1. However, the bridging portions C20 are grown from the decomposition layers. Thus, the chemical bonding strength is relatively low between the bridging portions C20 and the mask layers M20. The subsequent steps are the same as those described in the first embodiment.

4. Effects of Second Embodiment

In the second embodiment, the semiconductor array S2 has the leg portions C20a exhibiting a relatively low mechanical strength. The chemical bonding strength is not so high between the leg portions C20a and the mask layers M1. Thus, the semiconductor laminates D10 can be more easily separated from the substrate A20 than in the first embodiment.

The semiconductor array S2 has the effects described in the first embodiment.

5. Modifications 5-1. Mask Pattern and Bridging Portion Shape

The decomposition layers having any three-dimensional shape can be formed depending on the pattern of the masks M1. The shape of the decomposition layers is transferred to the bridging portions. Thus, the resultant bridging portions can have any shape.

5-2. Combination

The second embodiment may use any combination of the first embodiment and their modifications.

Third Embodiment

The third embodiment will now be described. The third embodiment involves the use of an uneven substrate on which a semiconductor layer having a non-polar or semi-polar flat surface is grown. Thus, the third embodiment will be described by focusing on the difference from the first embodiment.

1. Semiconductor Array

Figure 14:
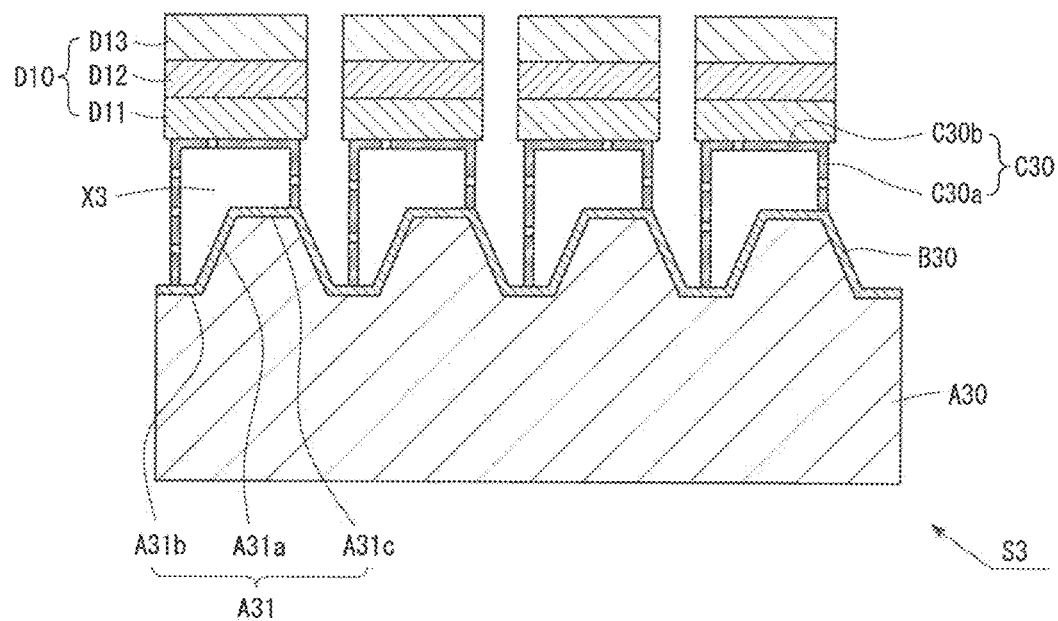
FIG. 14 schematically shows the configuration of a semiconductor array of a third embodiment.

FIG. 14 schematically shows the configuration of a semiconductor array S3 of the third embodiment. The semiconductor array S3 includes a substrate A30, a buffer layer B30, bridging portions C30, and semiconductor laminates D10.

The substrate A30 has an unevenly shaped portion A31. The substrate A30 has sloped portions A31a, bottom portions A31b, and flat top portions A31c. The bottom portions A31b and the flat top portions A31c are mutually parallel flat surfaces. The sloped portions A31a are side portions of the unevenly shaped portion A31. The buffer layer B30 is formed along the unevenly shaped portion of the substrate A30.

Each bridging portion C30 has a leg portion C30a and a top portion C30b. The bridging portions C30 are bridged from the bottom portions A31b over the flat top portions A31c of the substrate A30. The surface of the top portion C30b is a non-polar or semi-polar surface. The leg portion C30a is inclined by about 90° relative to the flat top portion A31c.

2. Void

The semiconductor array S3 has voids X3. The voids X3 are first voids. The voids X3 are defined by the unevenly shaped portion A31 of the substrate A30 and the bridging portions C30.

3. Production Method for Semiconductor Array

The third embodiment will be described by focusing on the difference from the first embodiment.

3. Growth of Decomposition Layer

In the third embodiment, the decomposition layer is grown through the technique disclosed in Japanese Patent Application Laid-Open (kokai) No. 2013-241337. Thus, the semiconductor layer is grown as shown in FIG. 1.B of Japanese Patent Application Laid-Open (kokai) No. 2013-241337.

4. Effects of Third Embodiment

In the third embodiment, the surface of each semiconductor layer of the semiconductor laminates D10 is a non-polar or semi-polar surface. For example, in the case where the second semiconductor layer D12 is a light-emitting layer, the wave function of holes effectively overlaps well with the wave function of electrons in the well layer of the light-emitting layer. Thus, the light-emitting device exhibits high internal quantum efficiency as compared with conventional cases.

The semiconductor array S3 has the effects described in the first embodiment.

5. Modifications

The third embodiment may use any combination of the first embodiment and their modifications.

EXAMPLES

1. Experiment A

1-1. Substrate

Figure 15:
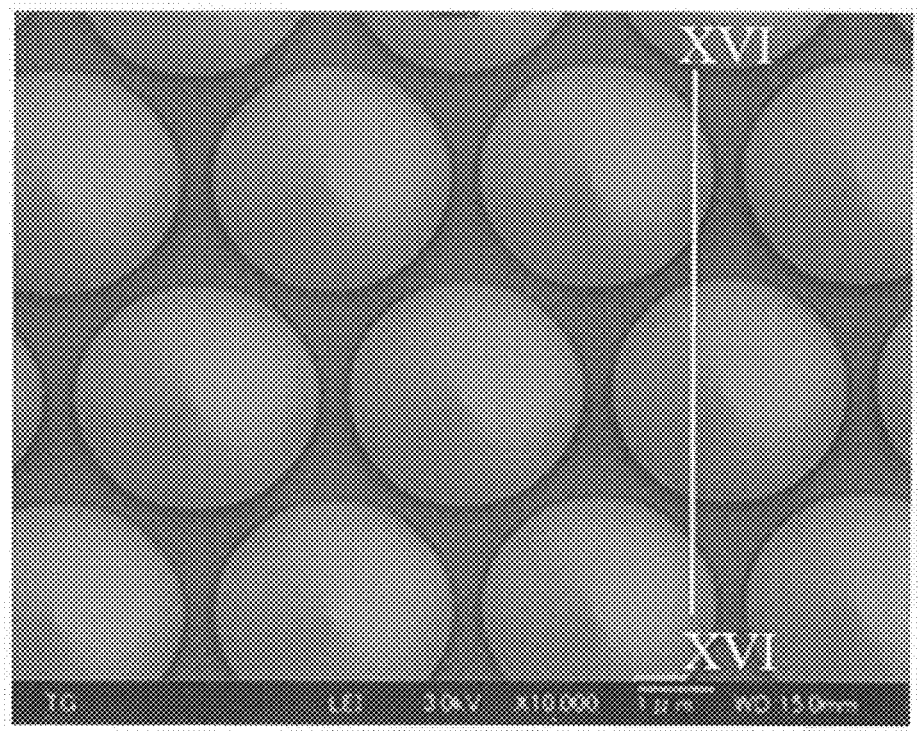
FIG. 15 is a scanning micrograph showing the surface of an uneven sapphire substrate used in experiments A to C.
Figure 16:
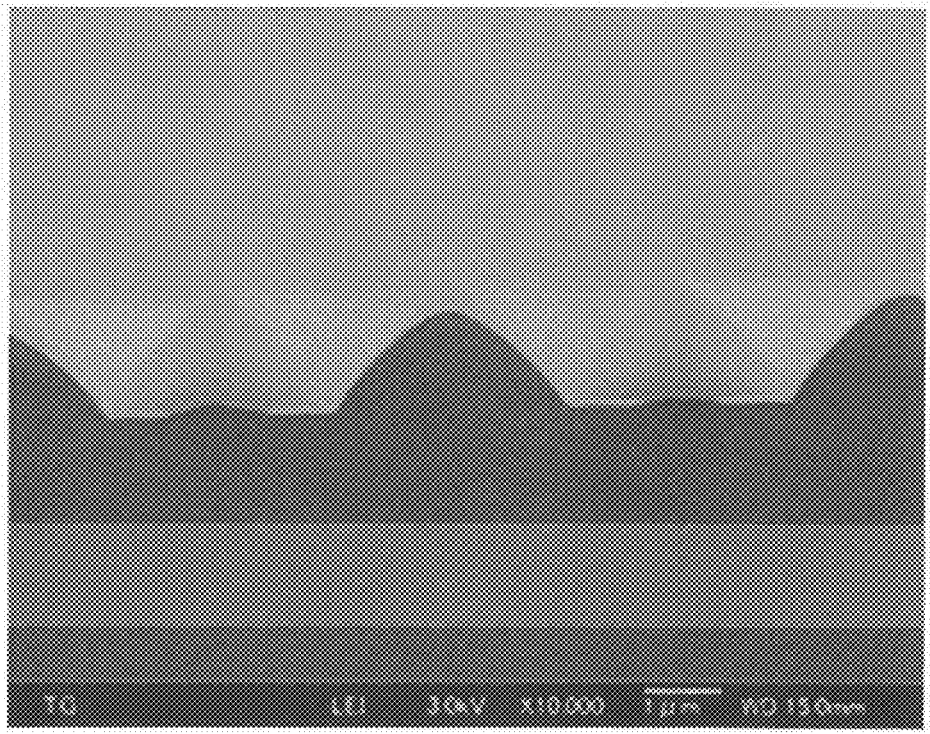
FIG. 16 is a cross-sectional view taken along line XVI-XVI of FIG. 15.

FIG. 15 is a scanning micrograph showing the surface of an uneven sapphire substrate. FIG. 16 is a cross-sectional view taken along line XVI-XVI of FIG. 15. As shown in FIGS. 15 and 16, a plurality of conical protrusions are arranged in a honeycomb pattern.

1-2. Decomposition Layer

Figure 17:
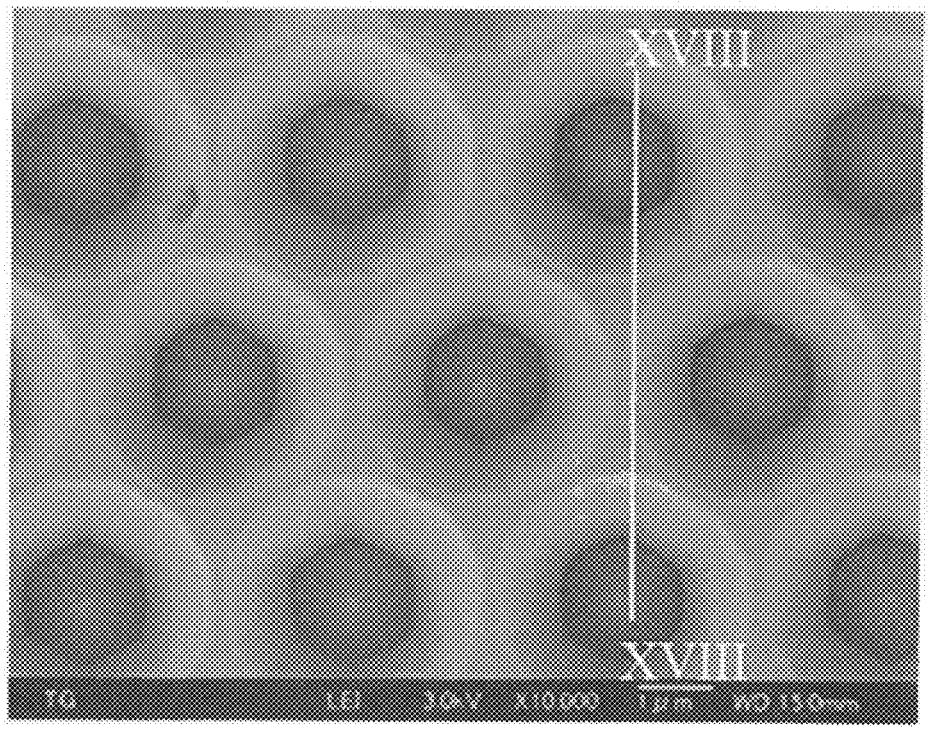
FIG. 17 is a scanning micrograph showing the surface of a structure including a sapphire substrate on which a buffer layer, a decomposition layer, and a bridging portion are formed in experiment A.
Figure 18:
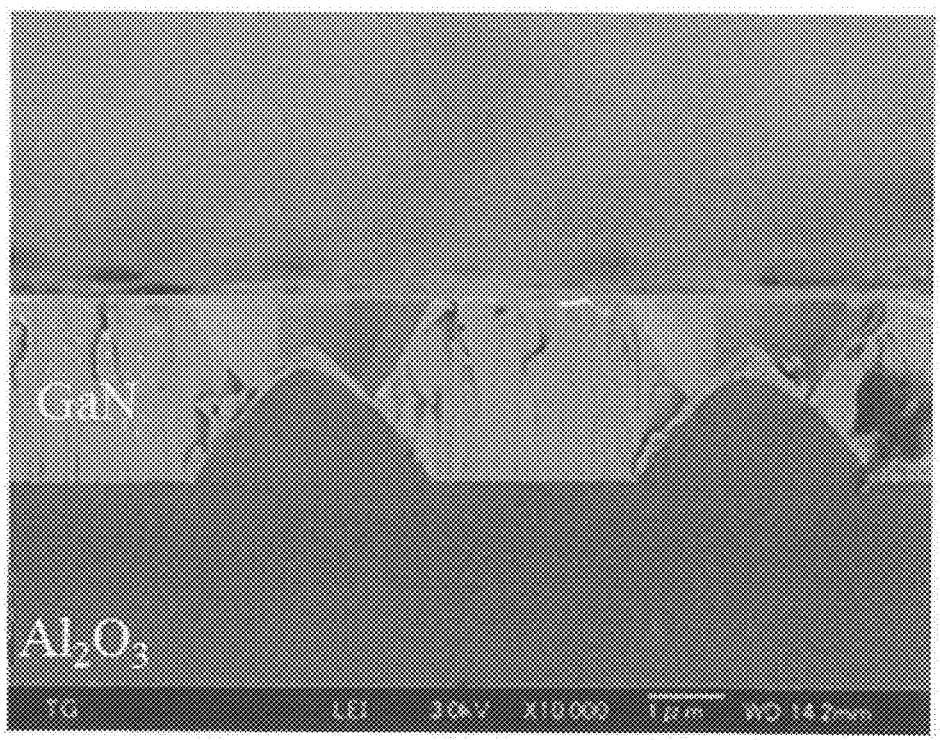
FIG. 18 is a cross-sectional view taken along line XVIII-XVIII of FIG. 17.

FIG. 17 is a scanning micrograph showing the surface of a structure including a sapphire substrate on which a buffer layer, a decomposition layer, and a bridging portion are formed. FIG. 18 is a cross-sectional view taken along line XVIII-XVIII of FIG. 17. The decomposition layer was formed from GaN. The bridging portion was formed from AlN through sputtering. The sputtering time was 50 seconds. The AlN bridging portion has a thickness of 14.3 nm.

1-3. Etching of Decomposition Layer

Figure 19:
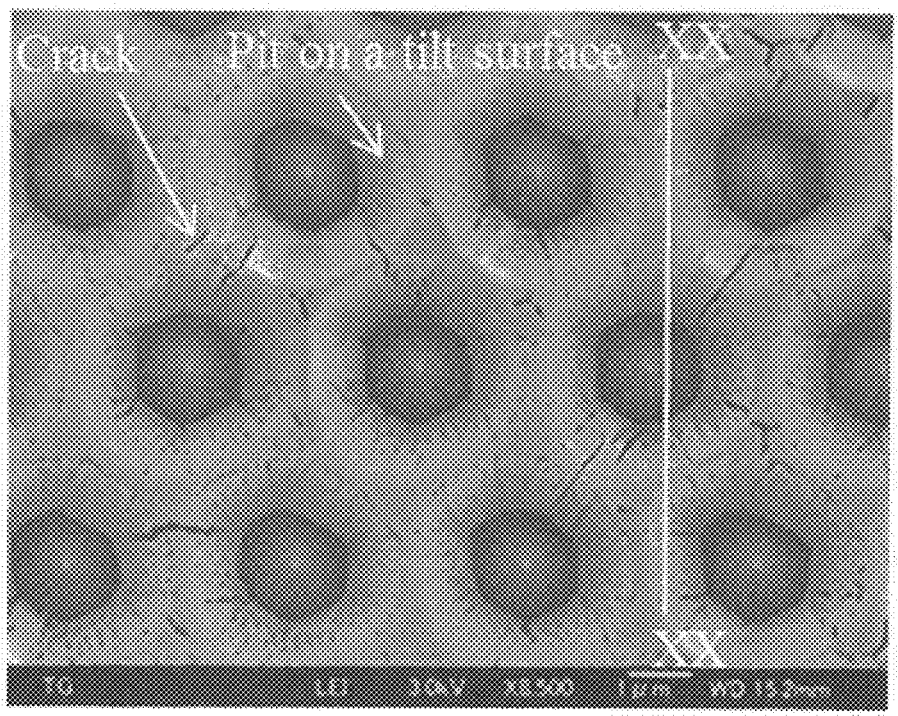
FIG. 19 is a scanning micrograph showing the surface of, for example, the bridging portion after etching of the decomposition layer in experiment A.

FIG. 19 is a scanning micrograph showing the surface of, for example, the bridging portion after etching of the decomposition layer. As shown in FIG. 19, the density of through holes in the leg portion C10a of the bridging portion C10 is higher than the density of through holes in the top portion C10b of the bridging portion C10. Thus, the through holes caused by the threading dislocations are concentrated in the leg portion C10a of the bridging portion C10.

As shown in FIG. 19, cracks are generated partially in the bridging portion C10. Cracks are probably generated during etching or cooling. Thus, cracks are less likely to be generated if the etching and film formation processes are continuously performed. Since the bridging portion C10 is stable as a whole, the semiconductor layer above the bridging portion C10 can be grown without causing any problem.

Figure 20:
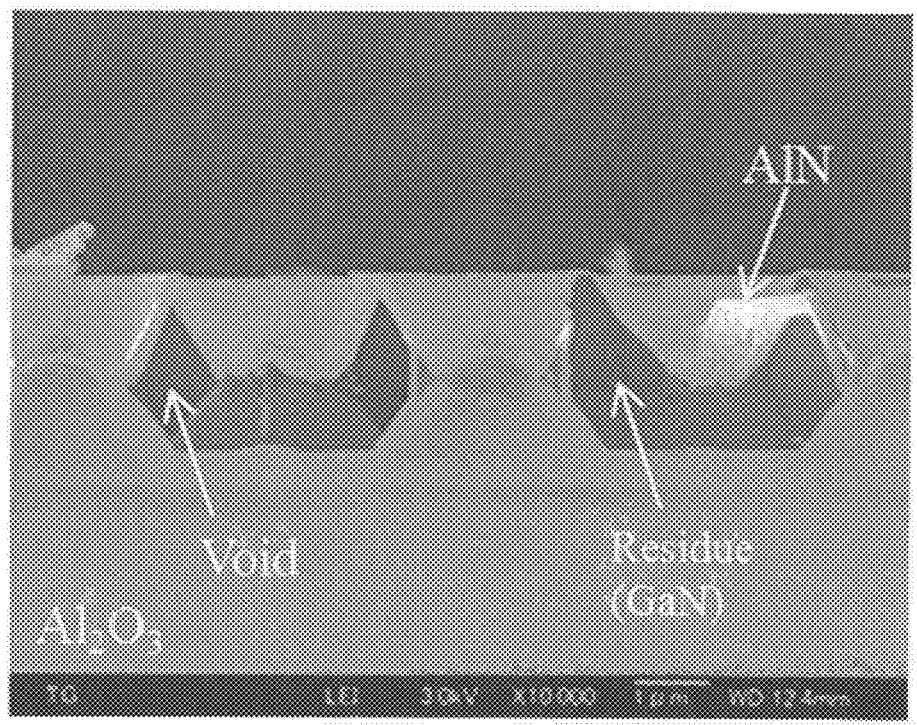
FIG. 20 is a cross-sectional view taken along line XX-XX of FIG. 19.

FIG. 20 is a cross-sectional view taken along line XX-XX of FIG. 19. As shown in FIG. 20, voids are observed on the left side, and a residue of the GaN decomposition layer is observed on the right side.

1-4. Position of Through Hole

As shown in FIG. 19, the through holes are concentrated in the leg portion C10a of the bridging portion C10. The semiconductor layer above the bridging portion C10 is grown from the top portion C10b of the bridging portion C10. Accordingly, the semiconductor layer above the bridging portion C10 exhibits a relatively low threading dislocation density. Thus, the semiconductor layer above the bridging portion C10 exhibits excellent crystallinity.

In experiment A, the uneven substrate having conical protrusions was used. However, even if the substrate A10 of the first embodiment is used, the bridging portion can be formed in the same way. The bridging portion having voids in the interior thereof are formed except that the shape is different.

2. Experiment B

2-1. Formation of Layers (Including Decomposition Layer)

The same uneven substrate as in experiment A was used in experiment B. A GaN layer (decomposition layer) was formed through MOCVD. An AlGaN layer (bridging portion) was formed through MOCVD. The Al content of the AlGaN layer was 35%. The thickness of the AlGaN layer was 25.8 nm.

2-1. Etching of Decomposition Layer

Figure 21:
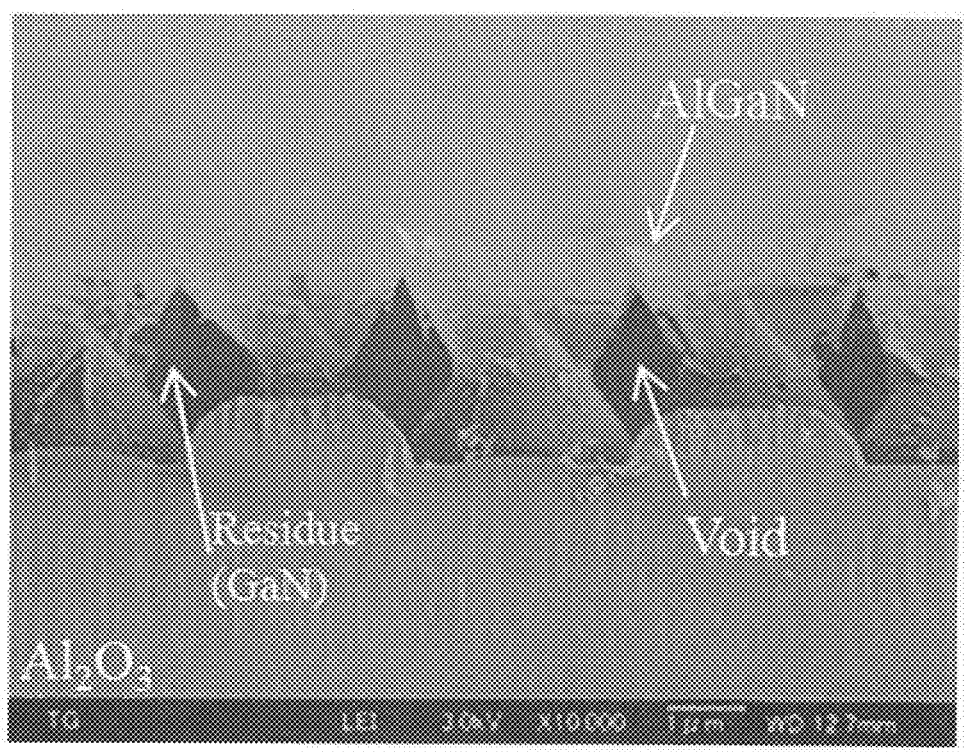
FIG. 21 is a scanning micrograph showing a cross section in the case of formation of an AlGaN layer for a bridging portion in experiment B.

FIG. 21 is a scanning micrograph showing a cross section in the case of formation of an AlGaN layer for a bridging portion. Even if the bridging portion is formed of an AlGaN layer, voids can be provided. In the case where the decomposition layer was formed of a GaN layer, the bridging portion was able to be formed of an AlGaN layer having an Al content of 5% to 35%.

In the case where the bridging portion is formed of an AlGaN layer, the composition of the bridging portion is similar to that of the decomposition layer when the Al content of the AlGaN layer is low. In such a case, the difference in lattice constant is reduced between the bridging portion and the decomposition layer. Thus, generation of cracks can be prevented. However, in such a case, the thermal decomposition temperature of the bridging portion is approximate to that of the decomposition layer. Thus, the bridging portion may undergo damage during thermal decomposition of the decomposition layer. Meanwhile, the composition of the bridging portion differs from that of the decomposition layer when the Al content of the AlGaN layer is high. In such a case, the bridging portion can be prevented from undergoing damage during thermal decomposition of the decomposition layer, but cracks are likely to be generated.

3. Experiment C

3-1. Formation of Layers (Including Decomposition Layer)

The same uneven substrate as in experiment A was used in experiment C. A GaN layer (decomposition layer) was formed through MOCVD. A low-temperature AlN layer (bridging portion) was formed through MOCVD at a low temperature of 300° C. to 600° C. The thickness of the low-temperature AlN layer was 25.8 nm.

3-2. Etching of Decomposition Layer

Figure 22:
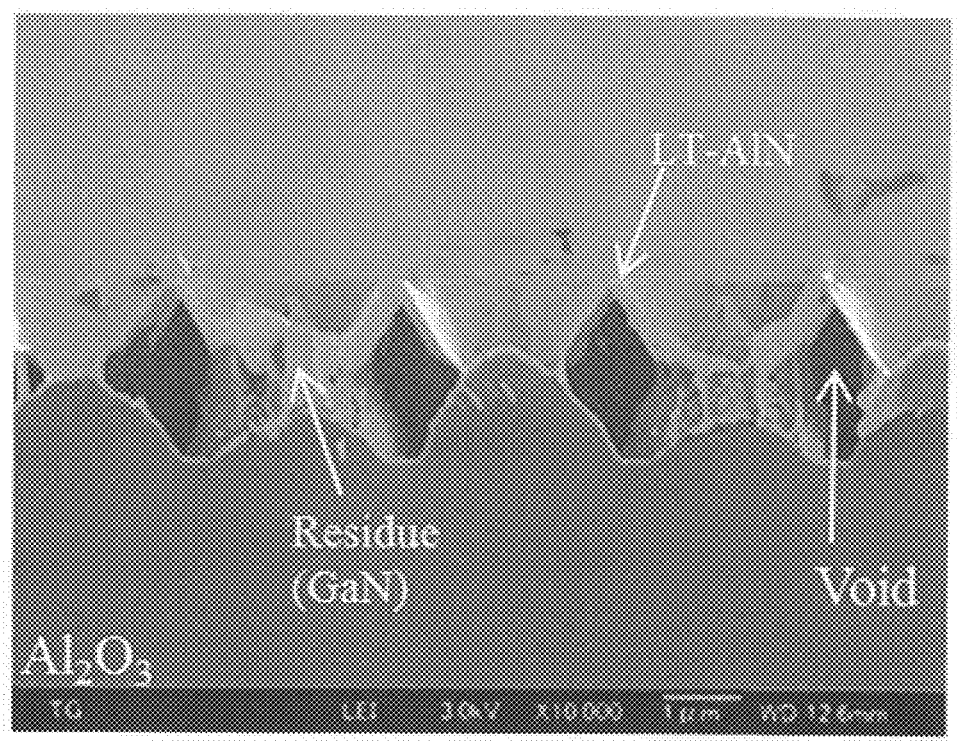
FIG. 22 is a scanning micrograph showing a cross section in the case of formation of a low-temperature AlN layer for a bridging portion in experiment C.

FIG. 22 is a scanning micrograph showing a cross section in the case of formation of a low-temperature AlN layer for a bridging portion. Even if the bridging portion is formed of a low-temperature AlN layer, voids can be provided.

4. Experiment D

4-1. Substrate

A substrate having a stripe-pattern unevenly shaped portion was used. A GaN layer having non-polar m-plane (decomposition layer) was formed through MOCVD, and an AlGaN layer (bridging portion) was formed through MOCVD.

4-2. Etching of Decomposition Layer

Figure 23:
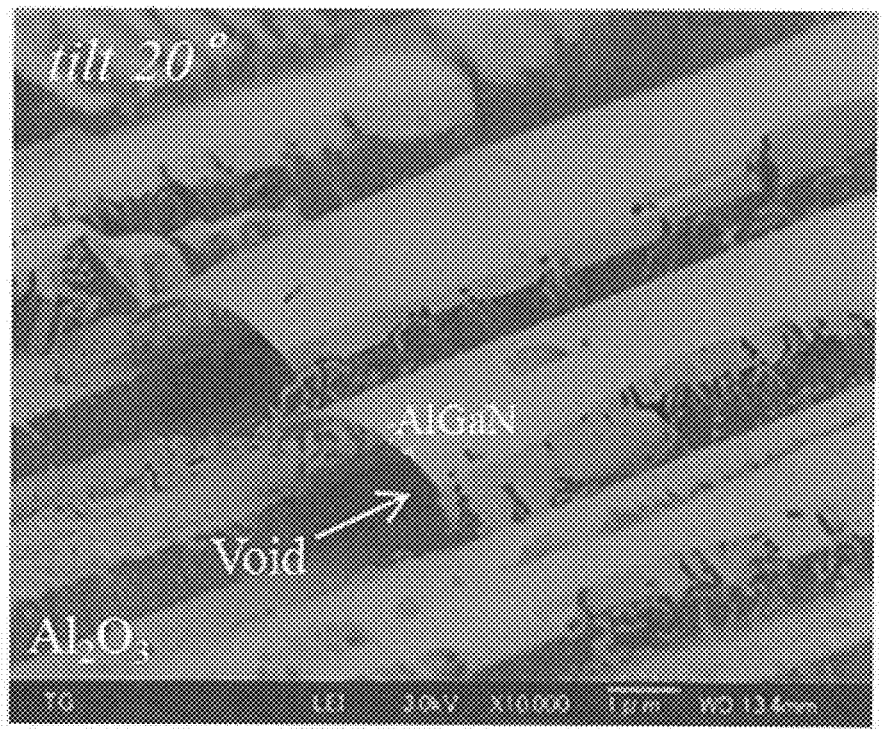
FIG. 23 is a scanning micrograph showing a region around a bridging portion after etching of a decomposition layer in experiment D.
Figure 24:
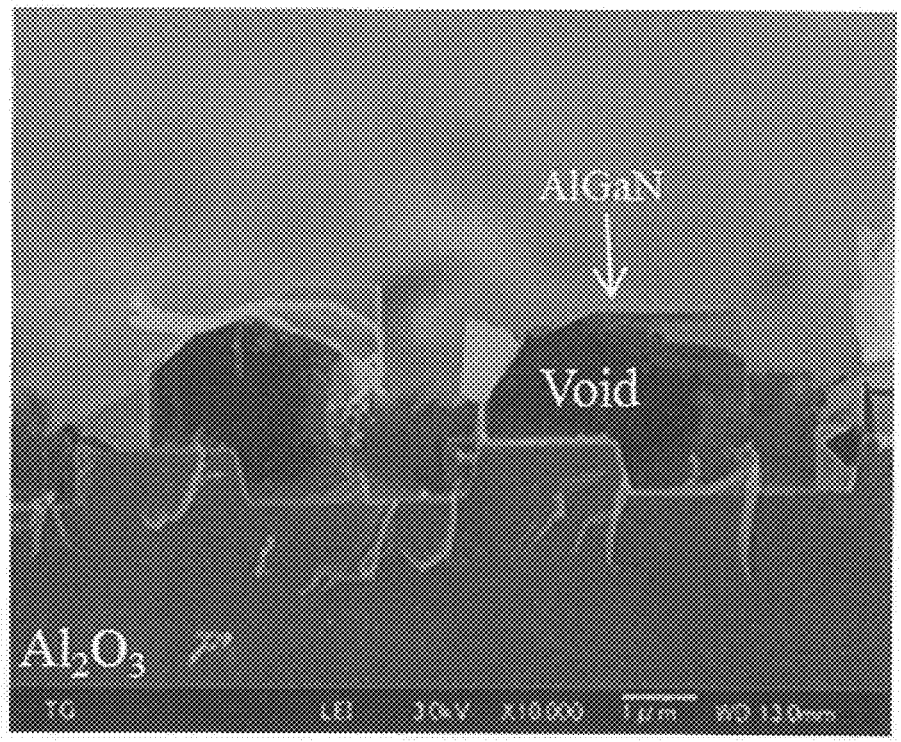
FIG. 24 is a scanning micrograph showing a cross section around the bridging portion after etching of the decomposition layer in experiment D.

FIG. 23 is a scanning micrograph showing a region around the bridging portion after etching of the decomposition layer. FIG. 24 is a scanning micrograph showing a cross section around the bridging portion after etching of the decomposition layer. As shown in FIGS. 23 and 24, voids are observed between the substrate and the AlGaN layer.

5. Experiment E

5-1. Thickness of Bridging Portion

Suitable voids were provided in the case where the thickness of the bridging portion C10 was about 8 nm to about 60 nm.

What is claimed is:

1. A method for producing a micro device, the method comprising:
    forming a decomposition layer;
    forming a bridging portion on the decomposition layer;
    decomposing the decomposition layer;
    forming a plurality of semiconductor laminates on the bridging portion;
    and separating the substrate from the semiconductor laminates, wherein, in the decomposition layer formation, a plurality of threading dislocations are extended during growth of the decomposition layer;

in the bridging portion formation, the bridging portion having a leg portion and a top portion is formed, and the threading dislocations are exposed to the surface of the bridging portion;

in the decomposition of the decomposition layer, the threading dislocations exposed to the surface of the bridging portion are widened to thereby provide a plurality of through holes penetrating the bridging portion, and the decomposition layer is decomposed through the through holes; and in the semiconductor laminate formation, each of the semiconductor laminates is grown from the top portion of the bridging portion.

2. The method for producing a micro device according to claim 1, wherein, in the decomposition of the decomposition layer, a decomposition product generated through decomposition of the decomposition layer is discharged via the through holes to an outside of the bridging portion, to thereby provide a void in a region where the decomposition layer has remained.

3. The method for producing a micro device according to claim 1, wherein,
in the decomposition layer formation, the decomposition layer is grown generally in the vertical direction at an initial stage of growth and is grown generally in the horizontal direction at a later stage of growth;
in the decomposition of the decomposition layer, first through holes of the through holes are provided in the leg portion;
second through holes of the through holes are provided in the top portion; and
a density of the first through holes is adjusted to be larger than a density of the second through holes.

4. The method for producing a micro device according to claim 1, wherein, in the bridging portion formation, the bridging portion is formed so that the top portion of the bridging portion has a thickness greater than a thickness of the leg portion.

5. The method for producing a micro device according to claim 1, wherein,
an uneven substrate having an unevenly shaped portion having a bottom portion and a plurality of protrusions is provided; and
in the decomposition layer formation, the decomposition layer is grown from the bottom portion of the unevenly shaped portion of the uneven substrate.

6. The method for producing a micro device according to claim 1, wherein the method further comprises forming a mask layer on a first region of a flat main surface of a substrate, wherein, in the decomposition layer formation, the decomposition layer is formed on a second region of the main surface on which the mask layer is not formed.

7. The method for producing a micro device according to claim 6, wherein, in the decomposition layer formation, the decomposition layer is formed so as to cover the second region and a portion of the surface of the mask layer, and, in the bridging portion formation, the bridging portion is formed so as to come into contact with the surface of the mask layer.

8. The method for producing a micro device according to claim 1, wherein, in the bridging portion formation, a facet plane is formed on at least a portion of the surface of the bridging portion.

* * * * *